US008219952B2

(12) United States Patent
Tehrani et al.

(10) Patent No.: US 8,219,952 B2
(45) Date of Patent: Jul. 10, 2012

(54) VARIATION AWARE VICTIM AND AGGRESSOR TIMING OVERLAP DETECTION BY PESSIMISM REDUCTION BASED ON RELATIVE POSITIONS OF TIMING WINDOWS

(75) Inventors: Peivand Tehrani, Camarillo, CA (US); Christopher Papademetrious, Saylorsburg, PA (US); Nahmsuk Oh, Goleta, CA (US)

(73) Assignee: Synopsys, Inc., Mountain View, CA (US)

( * ) Notice: Subject to any disclaimer, the term of this patent is extended or adjusted under 35 U.S.C. 154(b) by 541 days.

(21) Appl. No.: 12/391,241

(22) Filed: Feb. 23, 2009

(65) Prior Publication Data

US 2010/0218152 A1    Aug. 26, 2010

(51) Int. Cl.
*G06F 17/50* (2006.01)
(52) U.S. Cl. ......... 716/113; 716/119; 716/132; 716/139
(58) Field of Classification Search .................. 716/113, 716/119, 132, 139
See application file for complete search history.

(56) References Cited

U.S. PATENT DOCUMENTS 6,405,348 B1    6/2002  Fallah-Tehrani et al.
7,761,275 B2 *  7/2010  Chopra et al. .................. 703/14
2002/0104064 A1  8/2002  Sasaki et al.
2006/0112359 A1  5/2006  Becer et al.
2007/0156367 A1  7/2007  Kucukcakar et al.

OTHER PUBLICATIONS

Xiao, T. et al. "Using Temporal and Functional Information in Crosstalk Aware Static Timing Analysis", VLSI Design, 2002, vol. 15 (3), pp. 647-666.
Tehrani, P. F. et al. "Deep Sub-Micron Static Timing Analysis in Presence of Crosstalk", First International Symposium on Quality of Electronic Design, 2000, pp. 505-512.

* cited by examiner

*Primary Examiner* — Thuan Do
(74) *Attorney, Agent, or Firm* — Fenwick & West LLP

(57) ABSTRACT

A computer is programmed to identify a number of groups of timing windows, each group including a victim timing window and one (or more) aggressor timing window(s), respectively for a victim net and one (or more) aggressor nets in an IC design. The computer automatically slides (i.e. shifts in time) the victim and aggressor timing windows as a group for each die, i.e. by a specific amount that is identical for all timing windows of an instance of a coupled stage in a die, but differs for other instances of the same coupled stage in other dies. Crosstalk analysis is then performed, using time-shifted timing windows which result from sliding, to identify overlapping victim and aggressor nets, followed by variation aware delay calculations to identify timing violations and timing critical nets, followed by revision of the IC design, which is eventually fabricated in a wafer of semiconductor material.

22 Claims, 12 Drawing Sheets

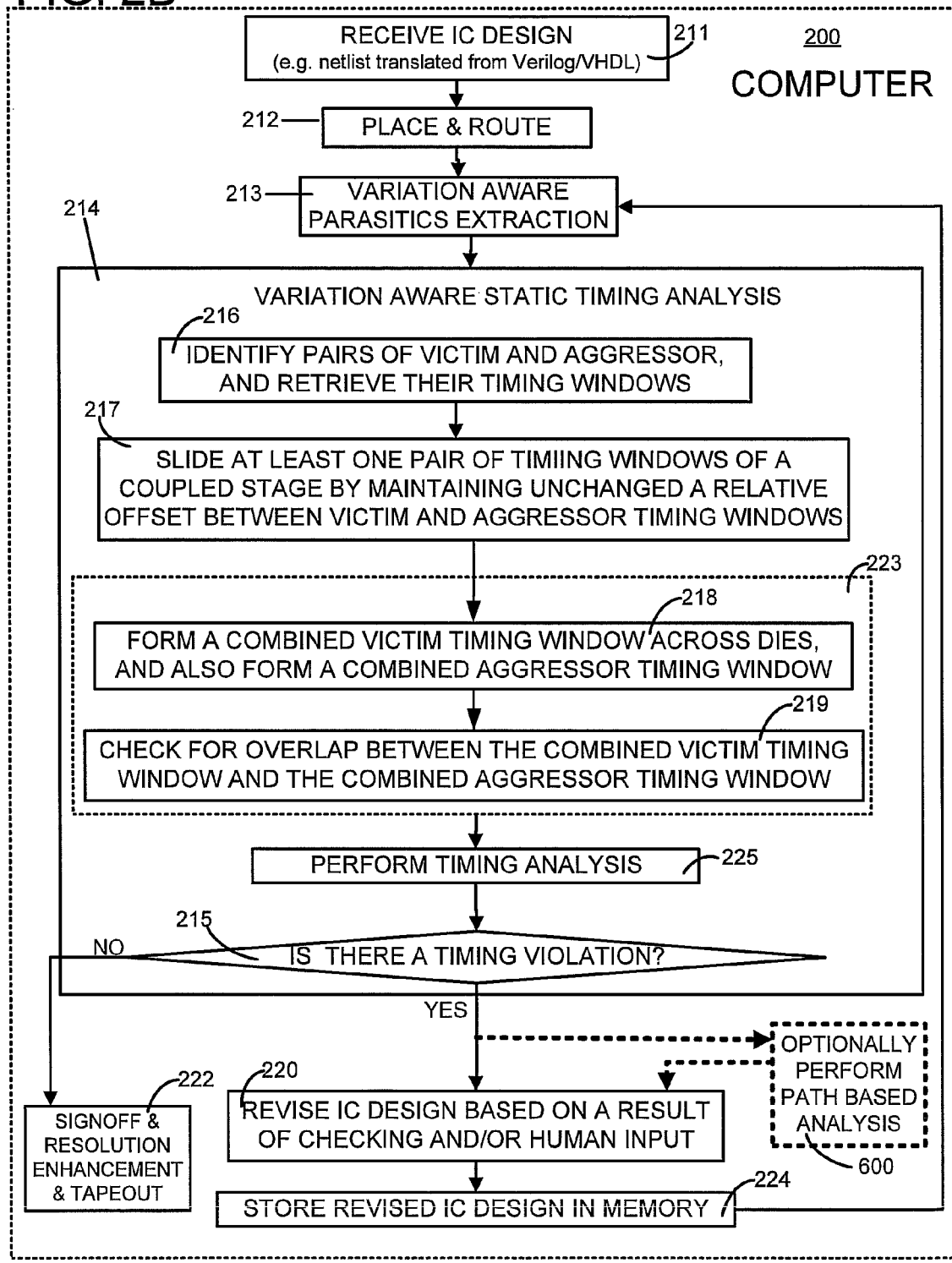

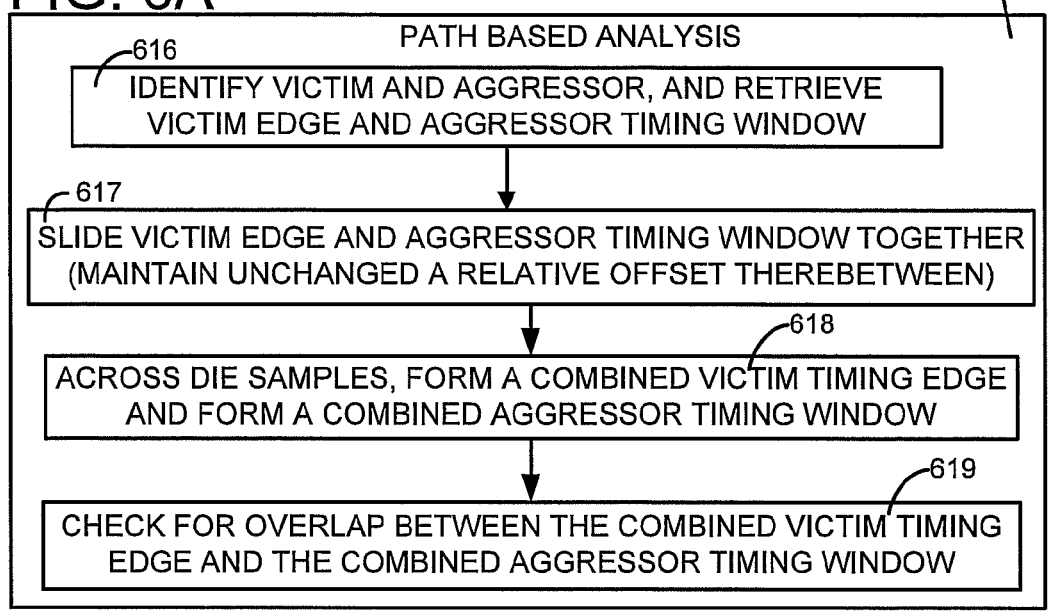

FIG. 6A

PATH BASED ANALYSIS

616 — IDENTIFY VICTIM AND AGGRESSOR, AND RETRIEVE VICTIM EDGE AND AGGRESSOR TIMING WINDOW

617 — SLIDE VICTIM EDGE AND AGGRESSOR TIMING WINDOW TOGETHER (MAINTAIN UNCHANGED A RELATIVE OFFSET THEREBETWEEN)

618 — ACROSS DIE SAMPLES, FORM A COMBINED VICTIM TIMING EDGE AND FORM A COMBINED AGGRESSOR TIMING WINDOW

619 — CHECK FOR OVERLAP BETWEEN THE COMBINED VICTIM TIMING EDGE AND THE COMBINED AGGRESSOR TIMING WINDOW

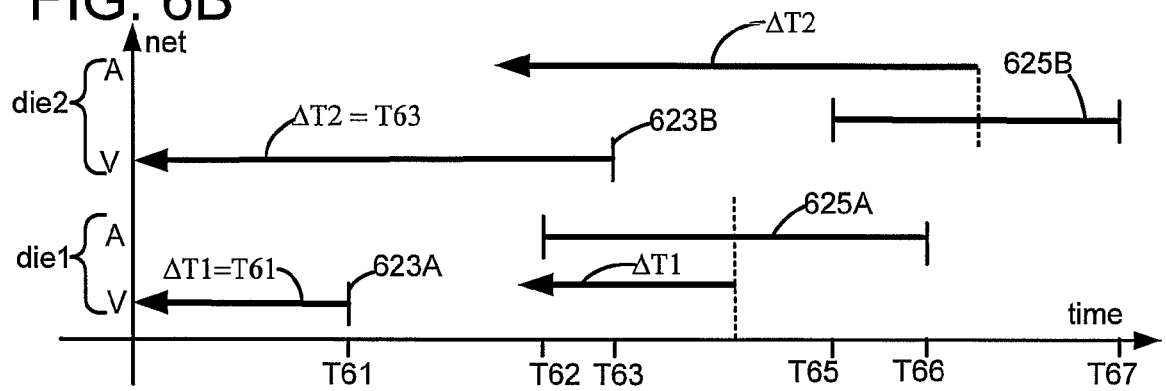

FIG. 6B

FIG. 6C

VARIATION AWARE VICTIM AND AGGRESSOR TIMING OVERLAP DETECTION BY PESSIMISM REDUCTION BASED ON RELATIVE POSITIONS OF TIMING WINDOWS

BACKGROUND

1. Field of the Invention

The invention relates to design of an integrated circuit (IC), for fabrication in a wafer of semiconductor material. More specifically, the invention relates to a method and an apparatus to reduce pessimism in identification of undesirable electrical interaction (called "capacitive crosstalk") which may arise between wires and/or devices that are physically placed and/or routed adjacent to one another in an IC design.

2. Related Art

Crosstalk is an undesirable electrical interaction between two or more physically adjacent wires in an integrated circuit (IC) device, due to capacitive cross-coupling 101 (also called "crosstalk") illustrated in FIG. 1A. As IC fabrication technologies advance toward smaller geometries, wires in the IC device become closer and taller, thus increasing the capacitance due to cross-coupling between nets in the IC device. At the same time, parasitic capacitance 102 (FIG. 1A) to the substrate becomes less, as interconnections become narrower, and cell delays are reduced as transistors become smaller.

Prior art software tools in the field of electronic design automation (EDA) are available to design circuitry (see step 103 in FIG. 1B), to place and route the circuitry for fabrication into a die (see step 104), perform parasitic extraction and static timing analysis (see step 105) and report on delays in signals due to crosstalk (see step 106). Parasitic extraction in step 105 can be either variation aware or corner based. For example, a tool called Star-RCXT VX available from Synopsys, Inc. of Mountain View Calif. can be used to report can be used for variation aware parasitic extraction, and the tool Star-RCXT itself can be used to extract corner specific parasitics. Similarly, static timing analysis in step 105 can be variation aware (e.g. using statistical static timing analysis) or corner specific (e.g. using voltage, temperature or process corners). For example, a tool called "PrimeTime®SI" available from Synopsys, Inc. can be used to report on delay changes and static noise. Another tool called "PrimeTime®VX" available from Synopsys, Inc. can be used for statistical static timing analysis. Note that both "PrimeTime®SI" and "PrimeTime®VX" are enhancements to a static timing analysis tool called PrimeTime® also available from Synopsys, Inc. A timing report which is generated by crosstalk analysis typically identifies violations in setup time, hold time and/or signal arrival used to generate an Engineering Change Order (ECO) as illustrated by step 107 (FIG. 1B). If there are no violations in step 108, the design is signed off, followed by resolution, and tape out, for fabrication of a wafer.

An aggressor net 111 (FIG. 1C) typically injects a crosstalk glitch onto a victim net 112 through one or more coupling capacitors 113. The crosstalk glitch impacts the delay (FIG. 1D) of victim net 112 by increasing or decreasing it. The amount of this increase or decrease is called "crosstalk delay" (FIG. 1D). Such a victim net 112 is typically present in a path (called "critical path") in the IC device consisting of timing nodes which represent pins on the path. A timing requirement on such a path may be expressed as the latest (or the earliest) time at which a signal can arrive without making the clock cycle longer (or shorter) than desired. Specifically, the arrival time is signal propagation time from a given starting point. Another timing requirement may be expressed in the form of slack which is the difference between the required time and the arrival time. When the slack of a path is negative, the path has a timing violation.

Timing violations are typically identified by performing crosstalk analysis, which checks if there is a timing overlap between changes in signals in adjacent nets. Analyzing whether changes in two signals have timing overlap is memory and processor intensive. Accordingly, for a pre-determined design corner e.g. process, voltage and temperature, certain prior art techniques identify two extremes, e.g. the slowest possible arrival time (i.e. the largest arrival time) and the fastest possible arrival time (i.e. the slowest arrival time), to form a window 115 (FIG. 1E) in which an aggressor's signal is expected to arrive ("aggressor window") at the aggressor's output. Similarly, another window 114 (FIG. 1E) is formed, in which a victim's signal is expected to arrive ("victim window") at the victim's output. As shown in FIG. 1E, victim window 114 is defined by the earliest arrival time Tvearly (i.e. the fastest possible arrival time), and the latest arrival time Tvlate (i.e. the slowest possible arrival time) of a signal at the victim's input (or output depending on the embodiment). Similarly, aggressor's window 115 is defined by the earliest arrival time Taearly and the latest arrival time Talate. For further information on such methods, see, for example, an article entitled "Using Temporal and Functional Information in Crosstalk Aware Static Timing Analysis" by Tong Xiao and Malgorzata Marek-Sadowska, VLSI Design, 2002 Vol. 15 (3), pp. 647-666, which is incorporated by reference herein in its entirety as background. See also US Patent Application Publication 2002/0104064 filed on Aug. 7, 2001, entitled "Electronic Circuit Device and Its Design Method" published on Aug. 1, 2002 by Yasuhiko Sasaki and Naoki Kato, which is also incorporated by reference herein in its entirety as background.

Note that the graph shown in FIG. 1E is not specific to any corner or variation (e.g. in voltage, temperature or process parameter). Instead, windows 114 and 115 in FIG. 1E arise due to inherent characteristics (such as asymmetry) of devices in the circuitry upstream from the victim and the aggressor (i.e. upstream from the coupled stage). In contrast, FIG. 1F illustrates a graph 141 at a fast corner (e.g. minimum delays throughout), and another graph 142 at a slow corner (e.g. maximum delays throughout). Note that a victim net's late edge Tvlate in the fast corner may occur (e.g. at time T3 in FIG. 1F) well in advance of that same victim's early edge Tvearly in the slow corner (e.g. at time T6 in FIG. 1F). Hence, if two victim windows 116 and 118 are combined, a combined victim window may extend from the earliest edge at time T1 (in the fast corner) to the latest edge at time T9 (in the slow corner). However, a combined victim window 144 may also be formed based on user-specified limits, such as 3σ, on probability density functions 145 and 146 of the victim signal's fastest and slowest arrival times, as discussed below, Similarly, aggressor windows 117 and 119 may be combined to form combined window 147.

Accordingly, to reduce pessimism inherent in checking if there is overlap between an aggressor window 115 and a victim window 114, it is now necessary to take into account changes in one or more physical characteristics that may vary depending on a number of factors, such as global and local variation in the process of fabricating the IC device, as a die in a wafer. Specifically, wafer fabrication process variations may be modeled by distributions of probability that in turn result in probability density (across all dies in the wafer) in the time required by a signal to reach a specific output of a circuit in each die, such as distribution 121 (FIG. 1G) of min arrival time at an output (of victim net 112). Similarly, another probability density (also across all dies in the wafer) 122 is available for the max arrival time at the same output (of victim net 112). Hence, certain prior art techniques use the two probability density functions 121 and 122 of arrival times (FIG. 1G), to construct a window 123 (FIG. 1G) having an early side at −3σ from the mid-point (i.e. mean 121C) of the min probability density 121 and a late side at +3σ from the midpoint (i.e. mean 122C) of the max probability density 122. The window 123 is also called a 3σ window, and this window is for the victim, i.e. a victim timing window. A similar 3σ window 125 is constructed and used for the aggressor, i.e. an aggressor timing window. 3σ is an arbitrary value that a user may specify to a tool that performs variation aware timing analysis. Any percentile value on the probability density function maybe used to represent the arrival window.

Due to the fact that variation aware windows (3σ windows) 123 and 125 (FIG. 1G) include the effects of process variations, they tend to be larger than corresponding individual windows 114 and 115 (FIG. 1E) of an individual die. The inventors of the current patent application have found that prior art windows (such as 3σ windows), which are used by some prior art tools, still make these tools pessimistic in identifying aggressors during crosstalk analysis. Specifically, the current inventors find that use of prior art windows can result in identification of false aggressors. For example, the current inventors note that aggressors may be identified as being present in a victim and aggressors combination even if they do not really exist, due to the manner in which 3σ windows 123 and 125 overlap. The overlap is illustrated in FIG. 1H, which shows the probability density functions for the combination where individual timing windows of a victim and its aggressor in each individual die do not in fact overlap one another. The just-described situation is illustrated in FIG. 1I, wherein timing windows 123A and 123B representing the victim net timing windows for two die samples do not overlap the corresponding timing windows 124A and 124B representing the aggressor net timing windows for the same two die samples. Nonetheless, when two or more victim windows 123A and 123B are combined to form a single window 123C, then the combined window 123C extends up to time T7 and overlaps with another combined window 125C that starts at time T6 formed by combining aggressor windows 125A and 125B. The current inventors note that use of combined windows 123C and 125C in crosstalk overlap analysis identifies an overlap in period T7-T6, although there is in fact no overlap between the individual windows 123A, 125A respectively of victim and aggressor pair in one die and similarly no overlap in the individual windows 123B, 125B respectively of victim and aggressor pair in another die.

US Patent Application Publication 2006/0112359 filed on Nov. 22, 2004 by Becer et al, entitled "Pessimism Reduction in Crosstalk Noise Aware Static Timing Analysis", and published on May 25, 2006 is incorporated by reference herein in its entirety as background. As per this patent publication, processes and systems for reducing pessimism in cross talk noise aware static timing analysis (and thus resulting false path failures) use either or both of effective delta delay noise and path based delay noise analysis. Effective delta delay determines an impact on victim timing of an action by aggressors that occur during a region where victim and aggressor timing windows overlap and determines an effective delta delay corresponding to any portion of the impact on victim timing that extends beyond the victim timing window. The effective delta delay is used to adjust the victim timing window. Path based delta delay determines an uncertainty in a switching time corresponding to a particular path for a victim resulting from an action (switching) by aggressors that occurs at the switching time, i.e. during a switching time window when uncertainty is included.

The current inventors believe that US 2006/0112359 does not disclose reducing pessimism in variation aware crosstalk analysis, as described below.

SUMMARY

A computer is programmed in accordance with the invention to identify a number of coupled stages, each coupled stage including a victim net and one or more aggressor nets located adjacent to the victim net in an IC design, and to identify the timing windows of each net in each coupled stage. The computer is further programmed to remove an amount that changes across a wafer as a function of variation parameter(s), from each net's timing window for a given instance of a coupled stage in a die, before the timing windows are used to form a combined timing window across multiple instances in multiple dies, for use in overlap analysis.

Specifically, in illustrative embodiments, the computer automatically slides (i.e. shifts in time) the timing window of each net in a coupled stage instance, by an amount ("specific amount") that is individually computed for that instance. In several embodiments, the specific amount ("victim-specific amount") is based on the relative position (in time) of the probability density functions of a victim net's early and late sides of its timing window for each instance of the coupled stage. In one example, a victim net's early and late timing window distributions are time shifted by the victim-specific amount which is preselected to be the position of the midpoint of the victim timing window. Note that this victim-specific amount is a distribution itself. In the illustrative embodiments, the computer also automatically slides each aggressor net's early and late timing window distributions by the same victim-specific amount which is used to time shift the corresponding victim timing window. Accordingly, in these embodiments, all timing windows, of a coupled stage are moved by the same amount, namely a specific amount that is computed for each instance. Note that the specific amount in alternative embodiments is not specific to a victim, and instead the alternative embodiments use an aggressor-specific amount to time shift all windows of a coupled stage instance, prior to combining timing windows across instances. Regardless of whether the specific amount is victim-specific or aggressor-specific, the embodiments described in this paragraph can be implemented using either Monte Carlo simulation as discussed next or even using closed form equations as discussed below.

In certain embodiments that use Monte Carlo simulation, the specific amount described in the previous paragraph is a scalar quantity for each victim net in each individual die sample which is specifically computed for each sample. Time-shifted victim timing windows that correspond to one another across a wafer are then combined by the computer to obtain a combined victim timing window. Similarly, time-shifted aggressor timing windows that correspond to one another across the wafer are combined by the computer, to obtain a combined aggressor timing window.

In other embodiments that use closed form equations, the specific amount is a probability density function that is statistically subtracted from the probability density functions of each of the victim timing window and the aggressor timing window(s), based on covariance. The time-shifted victim timing window and the time-shifted aggressor timing window are thereafter used in the normal manner for crosstalk analysis in closed form embodiments, e.g. by determining 3σ values to form a combined victim timing window and combined aggressor timing window(s).

In several embodiments (which may use either Monte Carlo simulation or closed form equations as discussed above), the computer uses the combined victim timing window and each combined aggressor timing windows, to determine if there is an overlap, and does so with less pessimism than prior art, due to reduction or elimination of a specific amount from this overlap analysis. The overlap analysis is followed by crosstalk affected delay calculations by the computer, to identify timing violations and timing critical nets in each die, followed by revision of the IC design, which is eventually fabricated in a wafer of semiconductor material.

BRIEF DESCRIPTION OF THE DRAWINGS

FIG. 2B illustrates, in a high-level flow chart, a method performed by the computer of FIG. 2A, in accordance with the invention.

FIG. 6A illustrates, in a flow chart, acts that are optionally performed in some embodiments, to implement a path based analysis to detect overlap between a victim timing edge and an aggressor timing window.

FIGS. 6B and 6C illustrate, in graphs, sliding of the timing edge of the victim and the timing window of the aggressor. In two different samples in accordance with the invention, in accordance with the method of FIG. 6A.

DETAILED DESCRIPTION

Figure 1A:
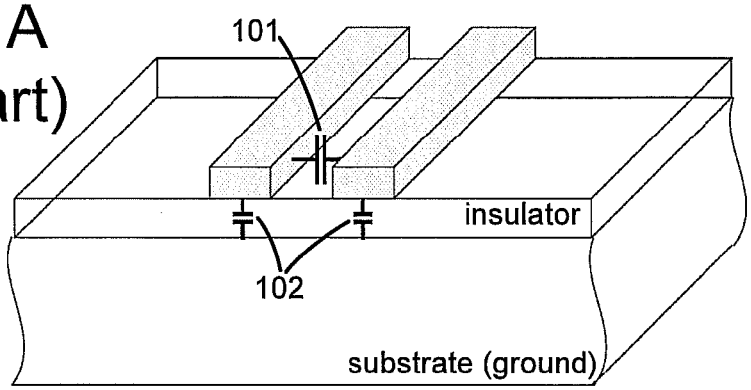
FIG. 1A illustrates a prior art IC designs showing an enlarged view of two parallel metal interconnections that are sufficiently close to experience capacitive cross coupling.
Figure 1B:
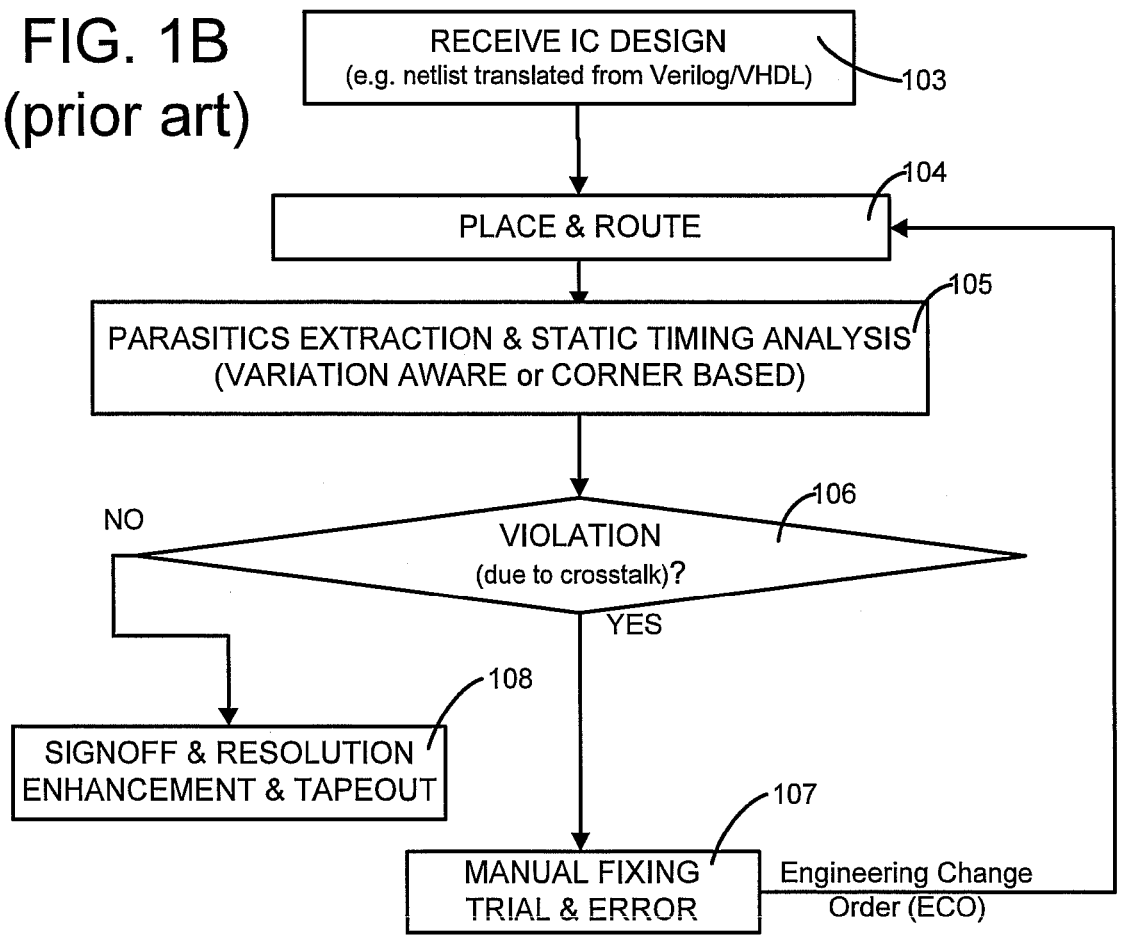
FIG. 1B illustrates, in a flow chart, a method for correcting crosstalk induced timing violations in an IC design in a prior art method.
Figure 1C:
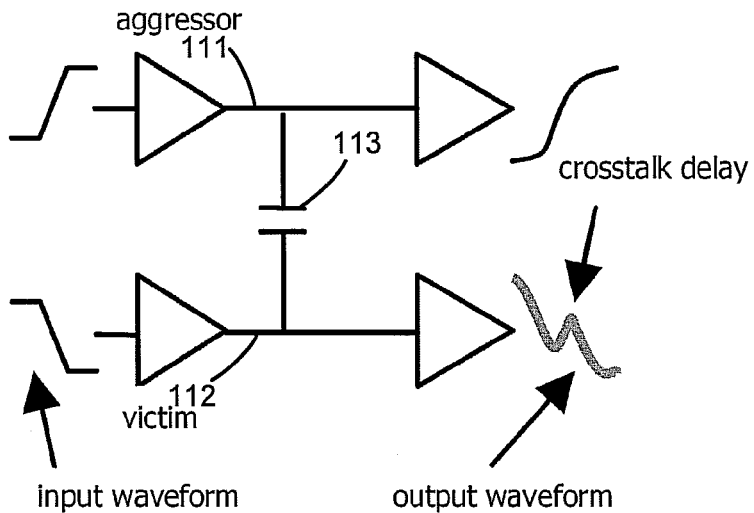
FIG. 1C illustrates prior art electrical circuitry in the form of an aggressor net and a victim net that include the metal interconnections of FIG. 1A.
Figure 1D:
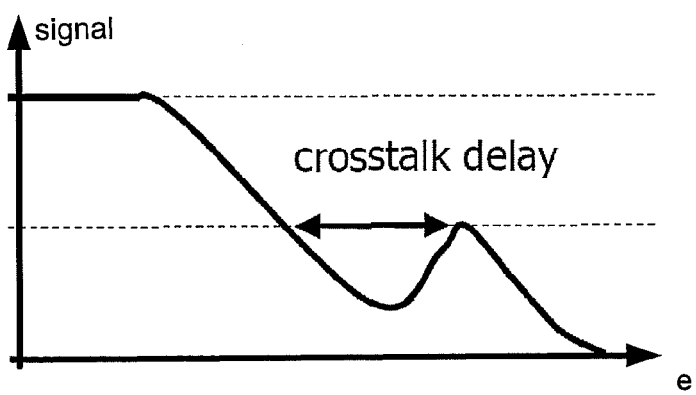
FIG. 1D illustrates, in a graph of a signal as a function of time, crosstalk delay in the prior art circuit of FIG. 1C.

A computer 200 (FIG. 2A) is programmed in several illustrative embodiments of the invention to automatically receive in an act 211 (FIG. 2B), an IC design in the form of a netlist 201 (FIG. 2A) that is generated by software from a specification by a human, in a high level hardware description language, such as Verilog or VHDL. Thereafter, in act 212 (FIG. 2B) computer 200 invokes a place and route tool 226 (FIG. 2A), with a received IC device's design (also called simply IC design), to place blocks of circuitry and routes wires therebetween, thereby to generate and store in memory 210 of computer 200, a layout 202 for IC device 221. Later, in an act 213 (FIG. 2B) computer 200 invokes a variation aware parasitic extraction tool 227 (FIG. 2A) based on the design and the layout to generate and store in its memory 210, variation aware parasitics 203 of the IC design. Thereafter, in act 214 (FIG. 2B) computer 200 invokes a variation aware static timing analysis tool 228 (FIG. 2A), to estimate timing behavior of the layout 202 obtained from a place and route operation, based on the variation aware parasitics 203. At this stage, computer 200 generates and stores in its memory 210, certain data 205 which identifies in the IC design, timing windows of various nets.

Figure 2A:
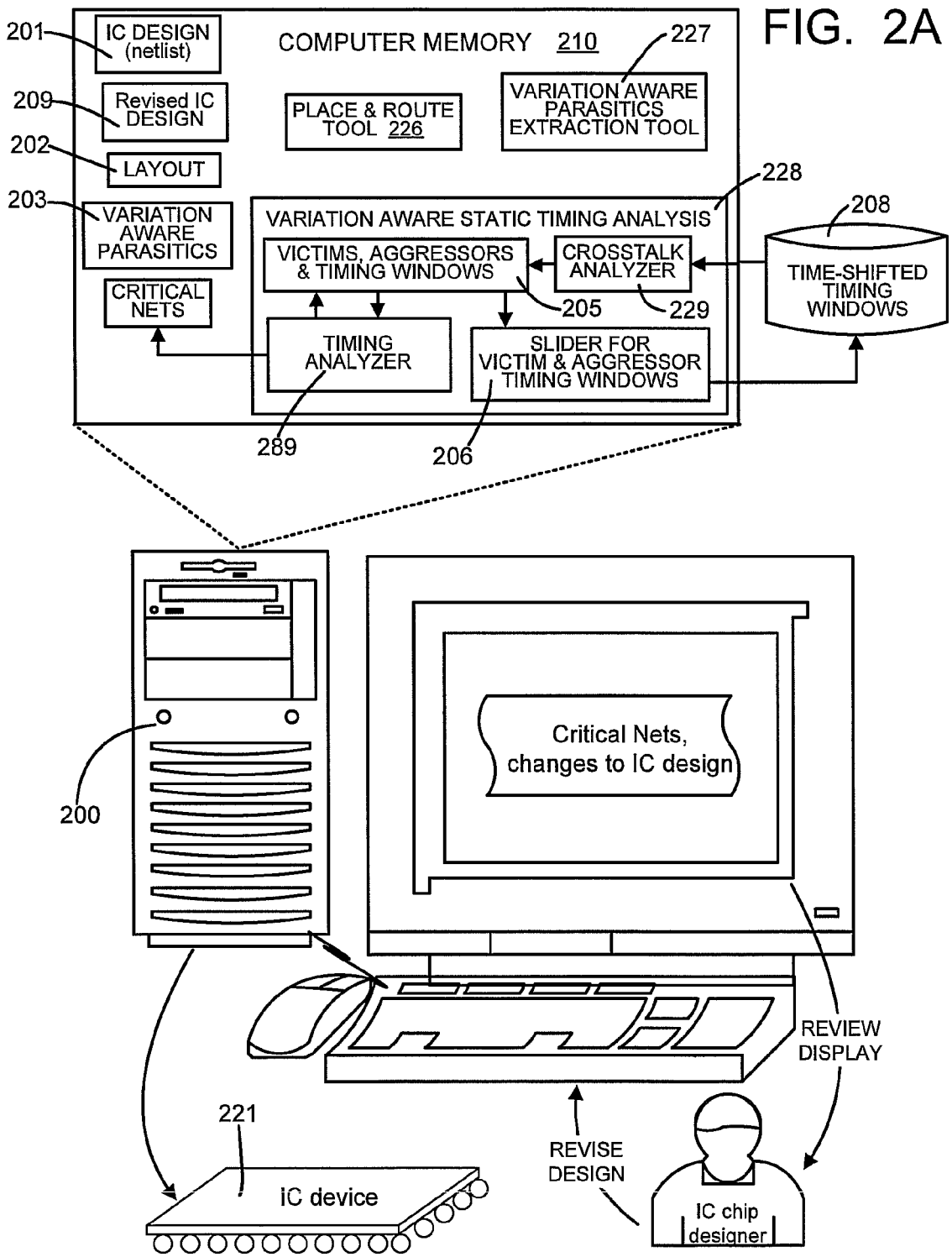
FIG. 2A illustrates, in a block diagram, a computer that is programmed in accordance with the invention.

Thereafter, data 205 (FIG. 2A) is analyzed in a block based approach as per act 214 (FIG. 2B) to determine whether there are any timing violations, and/or noise violations. A crosstalk analyzer included within the variation aware static timing analysis tool 228 (FIG. 2A) is invoked to identify victims and aggressors, by determining whether there is overlap between timing windows. Timing violations are typically identified (at the end of variation aware static timing analysis in act 214) as a list of endpoints of corresponding paths in the netlist. Noise violations are typically identified (at the end of static noise analysis) as a list of victim nets in the netlist. If any such violations are found an ECO scheme is used to revise the design as per act 220 (FIG. 2B).

Accordingly, in act 216, (FIG. 2B) which is performed by executing variation aware static timing analyzer 228 (FIG. 2A), certain embodiments of computer 200 are programmed to retrieve previously stored variation aware timing windows 205 (FIG. 2A) for a victim net and its corresponding aggressor nets. Note that up to this stage, tools 226 and 227 which are used by computer 200 in accordance with the invention are any commercially available tools, and they are used by computer 200 in the normal manner. Accordingly, victim nets and their corresponding aggressor nets that form coupled stages are identified, for example, based on a coupling capacitor found to be present therebetween by variation aware parasitic extraction tool 227. Moreover, variation aware timing windows 205 are also computed in the normal manner, for example based on delta delay calculations.

Figure 1E:
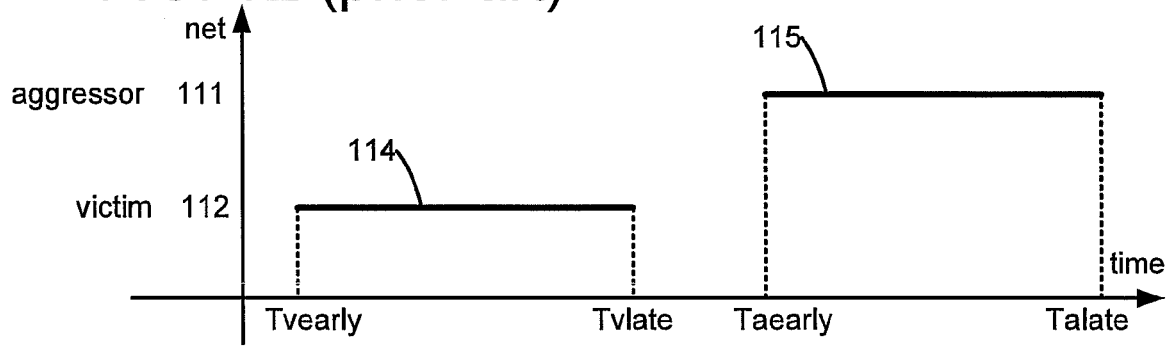
FIGS. 1E-1I illustrate, in graphs with a net's identity on the y-axis and time on the x-axis, timing windows for a victim net and an aggressor net in the prior art of FIGS. 1A-1D.
Figure 1F:
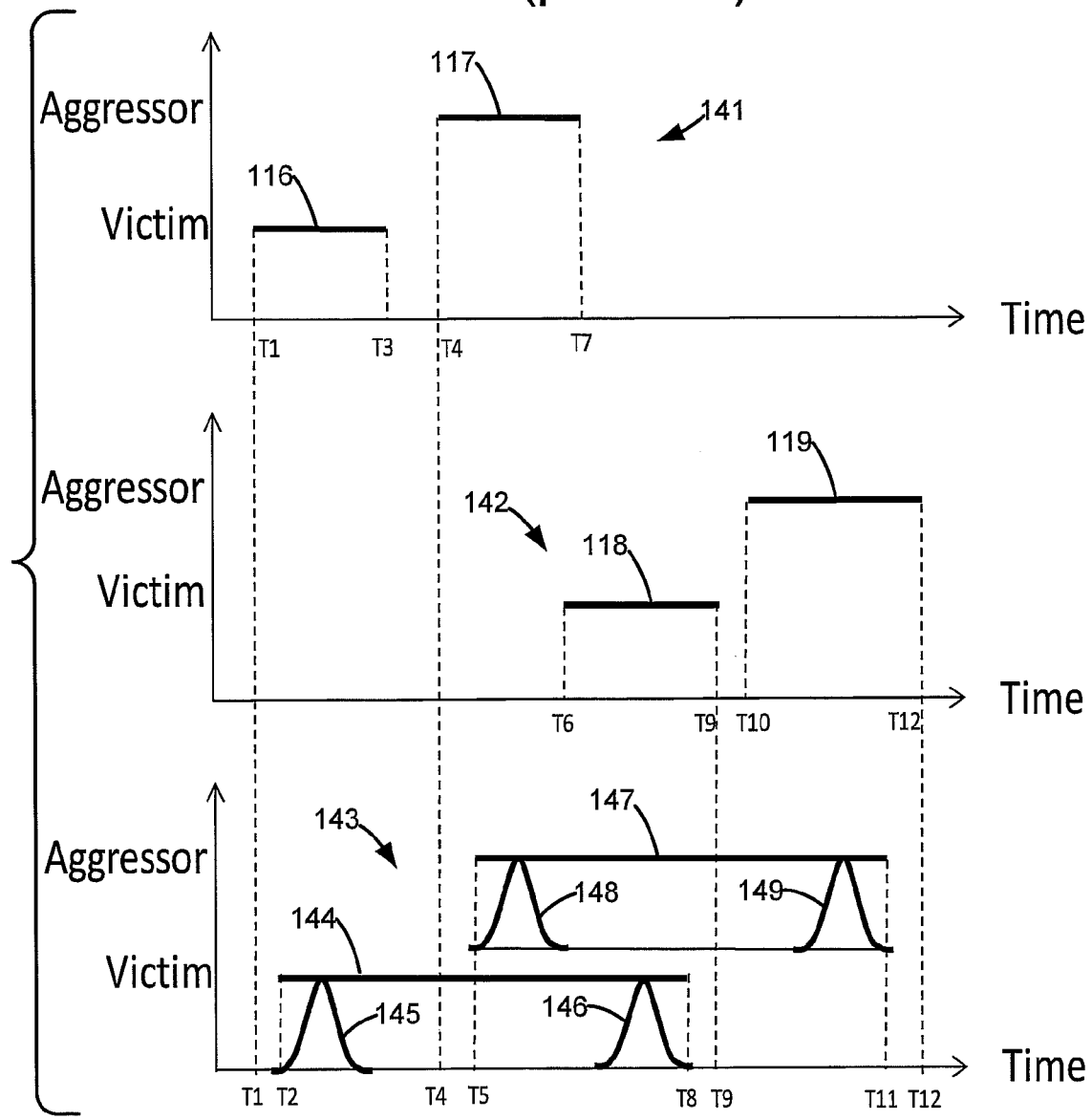
Figure 1G:
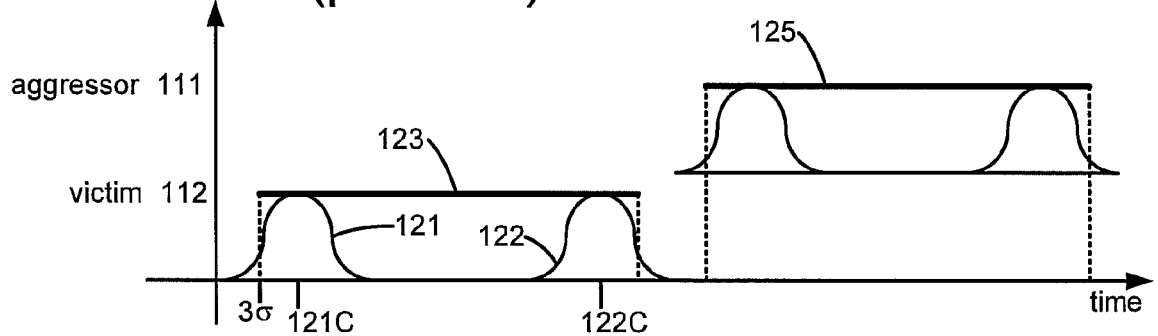

In embodiments that use Monte Carlo simulation, data 205 includes for each individual die, at least a pair of timing windows for a coupled stage as follows: victim timing windows for arrival of victim signal for each individual die at input (or alternatively at output) of a victim net, and aggressor timing windows for arrival of an aggressor signal at an input (or alternatively at output) of aggressor net for each corresponding individual die. Each individual die's victim timing window is represented referring to the example illustrated in FIG. 1E, computer 200 in data 205 at this stage, in data that includes identification of victim 112, aggressor 111, victim timing window 114 (i.e. Tvearly, Tvlate) and aggressor timing window 115 (i.e. Taearly, Talate). Although only one timing window is shown in FIG. 1E, data 205 typically identifies a number of coupled stages, each coupled stage including a victim net, its aggressor nets, as well as their respective timing windows, for each individual die. Also, as noted above, the identification of a victim and its aggressor(s) is conservative and is based on the variation aware extracted parasitic data 213 (FIG. 2B).

Figure 1H:
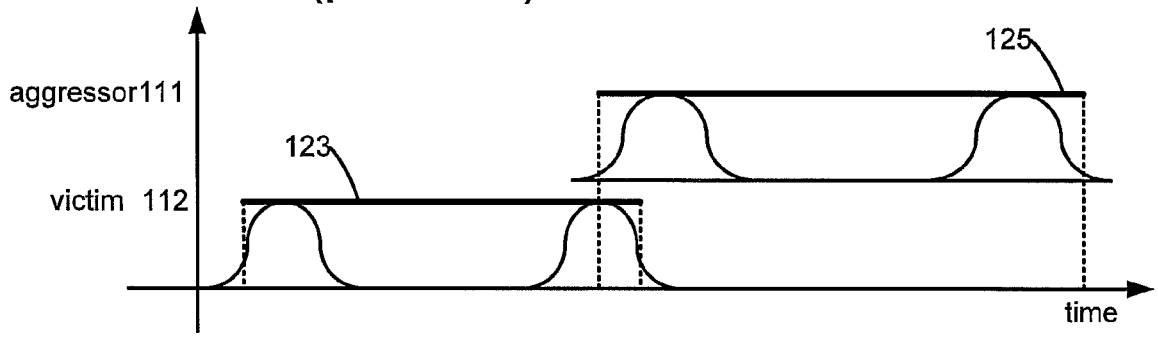
Figure 1I:
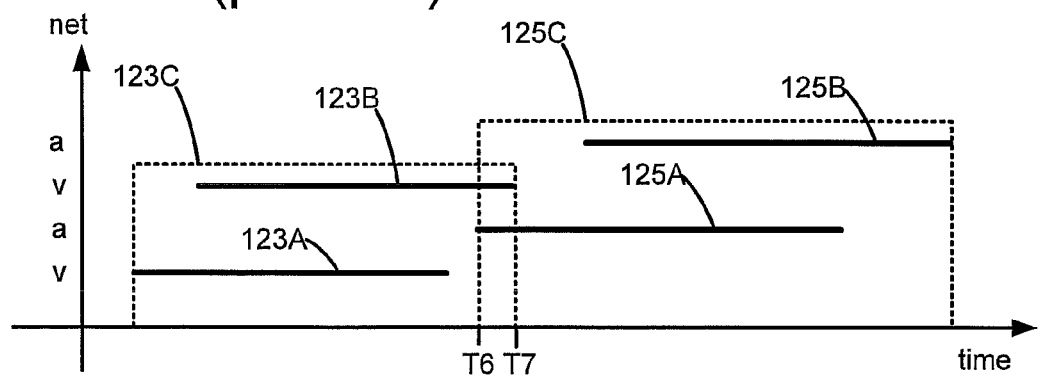

As illustrated in FIG. 1I, simply combining minimum and maximum timing windows from die samples, for corresponding instances of coupled stages therein, e.g. victim (123A and 123B) and aggressor (125A and 125B) would result in pessimistic timing windows 123C and 125C which point to an artificial overlap in T6 to T7 time range. To overcome this pessimism, computer 200 is programmed, in accordance with the invention, as illustrated by act 217 in FIG. 2B, to slide the timing windows in victim and its aggressor(s) for each instance of a coupled stage, while maintaining unchanged a relative offset between each victim timing window and its aggressor timing window(s) in each individual die sample, although victim and aggressor timing window(s) of one die are time shifted relative to the corresponding victim and aggressor timing window(s) of another die sample. Specifically, in some embodiments, when performing act 217 in the above-described example, computer 200 changes each of Tvearly, Taearly, Tvlate and Talate by a specific amount that is identically applied to all nets in an instance of a coupled stage, i.e. within each individual die sample. Hence, relative offsets Tvearly-Taearly and Tvlate-Talate for a given victim and aggressor combination remain unchanged before and after act 217 within each die sample. Note that a precise value of the specific amount, by which the victim and aggressor timing windows are time shifted in act 217, depends on the embodiment. At the end of act 217 (FIG. 2A), the results thereof, namely time-shifted timing windows 208 (FIG. 2A) are stored in a computer readable storage medium, such as a dynamic random access memory (DRAM) or a hard disk, depending on the embodiment. In two types of embodiments, all timing windows of the coupled stage are moved by a victim-specific amount or by an aggressor-specific amount either of which is individually computed for each instance of the coupled stage in a die sample.

Next, in act 218 (FIG. 2B), time-shifted timing windows 208 are used by computer 200 to invoke a crosstalk analyzer 229 (FIG. 2A) within variation aware static timing analysis tool 228 (FIG. 2A), e.g. to form a combined victim window for the victim net, across multiple die samples of a wafer. Similarly, a combined aggressor window is also formed in act 218, for the aggressor net across multiple die samples of the same wafer. A combined timing window for the victim net and a combined timing window for the aggressor net may be formed in act 218 in any manner normally used in crosstalk overlap analysis, while using as input the corresponding time-shifted timing windows 208 (FIG. 2A) for each die sample, in making the combination. Thereafter, in act 219 (FIG. 2B), computer 200 checks whether there is an overlap between the combined aggressor window and the combined victim window. Analysis of timing overlap between the combined timing windows may also be performed in act 219 in any manner normally used in crosstalk overlap analysis, while using as input the combined timing windows resulting from act 218. To summarize, acts 218 and 219 are performed (collectively identified as a single step 223 in FIG. 2B), by a computer 200 programmed in accordance with the invention, in the normal manner of crosstalk overlap analysis.

Thereafter, in act 225, computer 200 uses a list of victims and their aggressors resulting from act 219, with pre-existing information on process variations and physical characteristics within each die, to perform crosstalk affected delay calculations for each individual die sample of a wafer. Specifically, if an overlap is found to be present by step 223 (in a wafer as a whole), then a delay calculation ("crosstalk affected delay calculation") is performed in the normal manner in act 225 for each individual die (regardless of in which die the overlap was occurring) by a timing analyzer 289 that is included as a part of variation aware static timing analysis tool 228. Note that any timing analyzer 289 of the prior art may be used in act 225, e.g. as described in US Patent Publication 20070156367 dated Jul. 5, 2007 entitled "Method and Apparatus for Determining the Performance of an Integrated Circuit" by Kayhan Kucukcakar, Ali Dasdan, and Halim Damerdji et al published on Jul. 5, 2007 which is incorporated by reference herein in its entirety.

Note that the list of aggressors and victims as identified in act 219 is across the entire wafer, and this list is used to perform crosstalk affected delay calculations in act 225 for each individual die in the wafer. Next in act 215, the delays which are obtained by performing crosstalk affected delay calculation are used by computer 200 to identify one or more timing violations in the IC design, followed in act 220 by receiving changes to the IC design from a human to whom one or more nets in which timing violations occur ("critical nets") are displayed on a video monitor as illustrated in FIG. 2A. Any design changes that computer 200 receives in act 220 are used to revise the IC design, followed by act 224 in which computer 200 stores the revised IC design 209 in its memory 210.

A revised IC design 209 that is stored to memory in act 224 may be again analyzed in act 214 (as discussed above) in an iterative manner, by use of variation aware static timing analysis tool 228, followed by checking if there are any overlaps in act 215. Accordingly, act 215 may find that there is no timing violation in which case, act 222 is performed wherein the IC design is signed off, followed by resolution enhancement and tapeout, followed by fabrication of the IC device 221.

The current inventors believe that programming a computer 200 to perform an act 217 to slide a group of victim and aggressor timing windows by a victim-specific amount without any change in relative offset therebetween, is novel and nonobvious and has several advantages as discussed next. Specifically, act 217 enables combining time-shifted timing windows of a victim (and of its aggressor(s)), across multiple die samples in a semiconductor wafer, in a manner that excludes pessimism otherwise arising from presence of the victim-specific amount, which varies across die samples but combination of time-shifted windows as described herein keeps the variation associated within a die intact.

The current inventors recognize that the victim-specific amount may include multiple components from different sources. In one example of such a source recognized by the current inventors, arrival times of signals at victim and aggressor inputs (or outputs) change between die samples across a wafer by identical amounts, due to global variation in process parameters related to fabrication. In another example of such a source recognized by the current inventors, arrival times of a signal change across a wafer identically, due to the victim net and the aggressor net being both connected to a common node in the IC design. Regardless of the source, removal of the victim-specific amount, by sliding both the victim and aggressor timing windows as a group for each die sample under simulation in act 217 removes correlated timing behavior in the victim net and the aggressor net. For at least these reasons, the current inventors believe that performance of act 217 by computer 200 yields time-shifted timing windows that when combined in the normal manner across multiple die samples yields combined timing windows whose overlap analysis has less pessimism than prior art methods.

Figure 3A:
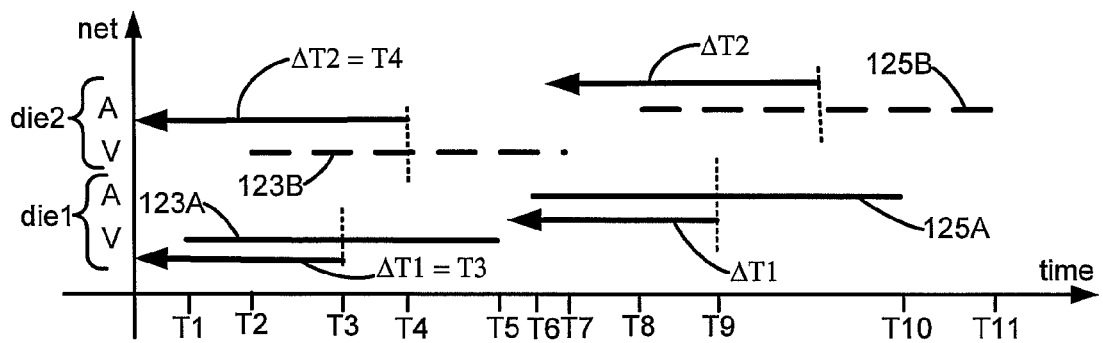
FIG. 3A illustrates, in graphs with a net's identity on the y-axis and time on the x-axis, sliding of timing windows of a victim net and an aggressor net in two different dies in accordance with the invention, when performing the method of FIG. 2A.
Figure 3B:
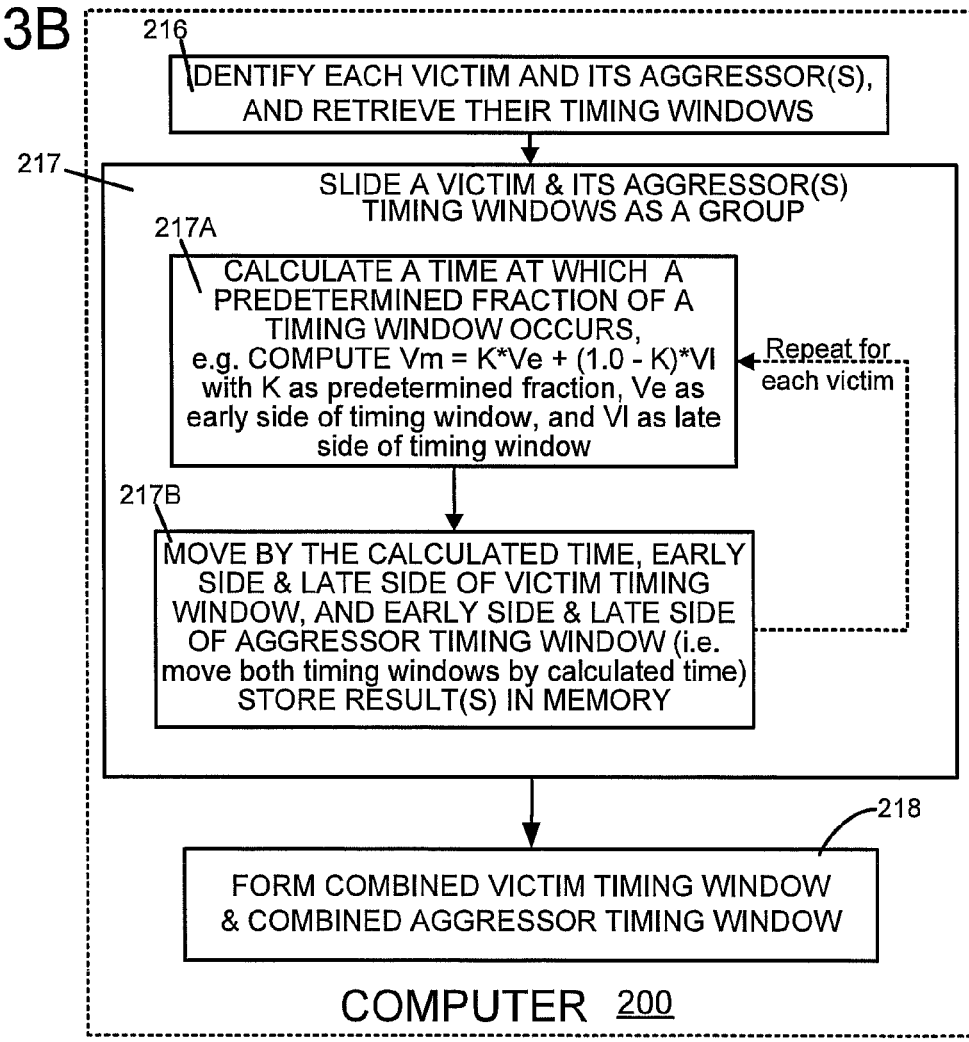
FIG. 3B illustrates, in a low-level flow chart, implementation of act 217 of FIG. 2B, in accordance with the invention.

In one illustrative example, sliding of windows in act 217 is performed for timing windows 123A, 123B, 125A and 125B of FIG. 1H in accordance with the invention as shown in FIGS. 3A and 3B. Initially, computer 200 calculates, as shown in act 217A of FIG. 3B, a victim-specific amount to be used in time-shifting, that is preselected to be a predetermined fraction of a timing window. Specifically, computer 200 calculates as the victim-specific amount (denoted as ΔT, to denote a time shift) the value Vm=K*Ve+(1.0−K)*VI, wherein Ve is the early side of the victim timing window, and VI is the late side of the victim timing window and K is the predetermined fraction. In the example of FIG. 1H which is further illustrated in FIG. 3A in accordance with the invention, for the victim timing window 123A, T1 is Ve and T5 is VI. If fraction K is predetermined to be 0.5, then Vm=0.5*T1+0.5*T5, which results in a victim-specific amount ΔT1 for die 1 to be the victim timing window's mid-point time T3 illustrated in FIG. 3A (i.e. center of window 123A).

Accordingly, T3 which has been computed at this stage by computer 200 represents victim-specific amount ΔT1 which is to be used in time-shifting both the victim window 123A and aggressor window 125A. Hence, in act 217B, the just-calculated T3 is subtracted from each of the following four times: early side T1 of victim timing window 123A, late side T5 of victim timing window 123A, early side T6 of aggressor timing window 125A and late side T10 of aggressor timing window 125A. Therefore, at the end of act 217B, both windows 123A and 125A (also called "original windows") are moved by victim-specific amount ΔT1 (towards the left in FIG. 3A), and the result of movement is time-shifted windows (not shown in FIG. 3A, but shown in FIG. 4A) which are written by computer 200 into its memory 210 and/or to a disk as data 208 (FIG. 2A). As original windows 123A and 125A are both moved by an identical duration (i.e. the same victim-specific amount ΔT1), a duration between the two windows remains unchanged before and after the just-described sliding.

Note that in a Monte Carlo embodiment in accordance with the invention, multiple die samples are used at different settings of variation parameters that change timing within a wafer, due to process variation in wafer fabrication, and for this reason, acts 217A and 217B are repeatedly performed, once for each pair of victim and aggressor timing windows in a die (also called "sample"). The specific variation in process parameters depends on the wafer fabrication process and the foundry. Examples of physical characteristics that depend on process parameters and affect timing include transistors effective channel length and threshold voltage. To account for such variations, typically thousands of samples are created in the Monte Carlo embodiment.

To ease understanding, in the example illustrated in FIG. 1H only two die samples are shown, and an initial performance of acts 217A and 217B described above, is for a first sample (i.e. for die1). Act 217A is therefore repeated, for at least a second sample (i.e. for die2): specifically another victim-specific amount ΔT2 is calculated using the predetermined fraction, e.g. to identify the center of victim timing window 123B, i.e. T4. Also, act 217B is performed again, now for the second sample, and the calculated value T4 which is to be used as the victim-specific amount ΔT2 for the second sample, is therefore subtracted from the early and late sides T2 and T7 respectively of victim window 123B and also subtracted from the early and late sides T8 and T11 respectively of aggressor window 125B. Therefore, at the end of act 217B for the second sample, both windows 123B and 125B are moved to the left by the same amount ΔT2, and the result of movement (i.e. time-shifted windows for the second sample) are written by computer 200 into its memory 210 and/or to a disk as data 208 (FIG. 2A). Note that acts 217A and 217B are repeated as many times as there are die samples in the Monte Carlo embodiment, e.g. thousands of times.

In the Monte Carlo embodiment, act 218 is implemented by computer 200 combining the time-shifted timing windows of a victim across all samples, to obtain a combined victim window. Also in act 218, the time-shifted timing windows of an aggressor, across all samples are combined by computer 200 to obtain a combined aggressor window. The multiple time-shifted timing windows (of a victim or of an aggressor) may be combined in act 218 in any manner commonly known to the skilled artisan. For example, a combined timing window for a victim is formed by using the earliest arrival time T21 (FIG. 4A) at the victim's input (or output) across all samples, as the early side of the combined victim window 424C. In this example, the latest arrival time T22 at the victim's input (or output) across all samples, is used as the late arrival side of the combined victim window 424C.

Figure 4A:
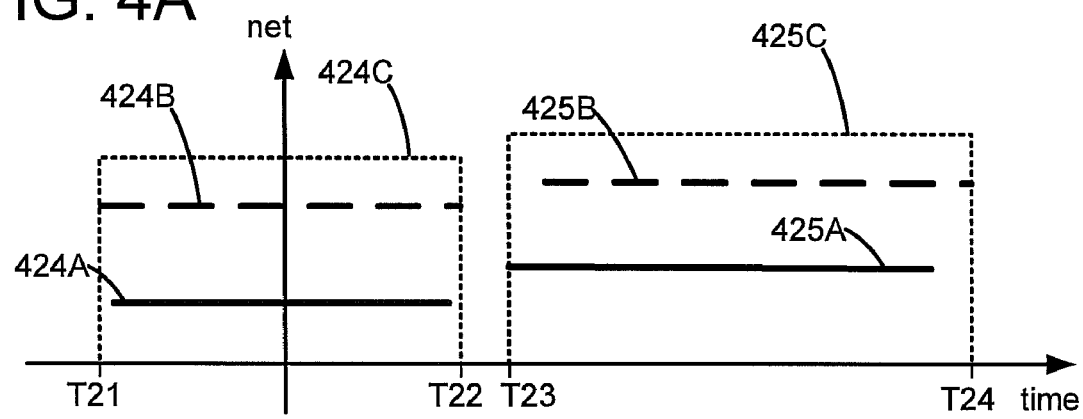
FIGS. 4A and 4B illustrate, in graphs, a net's identity on the y-axis and time on the x-axis, time shifted timing windows of a victim net and an aggressor net in two different samples in accordance with the invention, after performing act 217 of FIG. 2B, in accordance with the invention.

The current inventors note that a combined victim window 424C which results from act 218 is smaller than a corresponding combined victim window otherwise obtained by simply combining original windows 123A and 123B of the victim, because time-shifted windows 424A and 424B of the victim are aligned relative to one another. Specifically, in the above-described example as illustrated in FIG. 4A, the victim's time-shifted windows 424A and 424B are aligned at their respective centers, i.e. the centers of victim time-shifted windows 424A and 424B coincide with one another at the origin on the time axis, i.e. at time T=0. Due to the alignment of the centers of the victim time-shifted windows 424A and 424B, the combined victim window 424C in this embodiment is as large as the largest victim timing window across all samples, which is window 424B as illustrated in FIG. 4A.

Also, in act 218, the combined aggressor window 425C is determined in the normal manner by computer 200, e.g. by using the earliest arrival time T23 at the aggressor's input (or output) across all samples, as the early side of a combined aggressor window 425C, and the latest arrival time T24 at the aggressor's input (or output) across all samples, as the late arrival side of combined aggressor window 425C. Thereafter, the combined victim window and the combined aggressor window are used in the normal manner, specifically to check for overlap therebetween in act 219. In the example of FIG. 4A, no overlap is found by the crosstalk overlap analyzer in variation aware static timing analysis tool 228, because the victim's combined window 424C is separated from the aggressor's combined window 425C, by duration T23-T22.

Figure 4B:
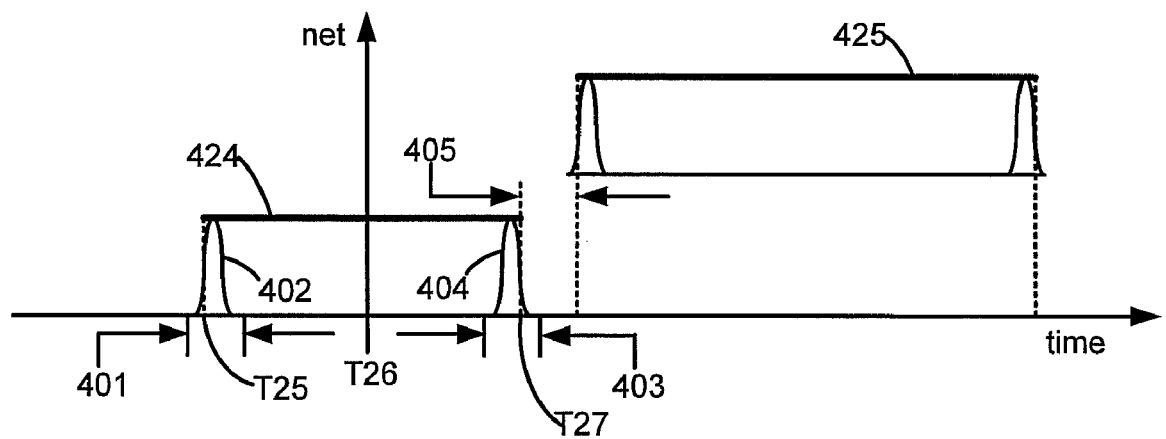
Figure 4C:
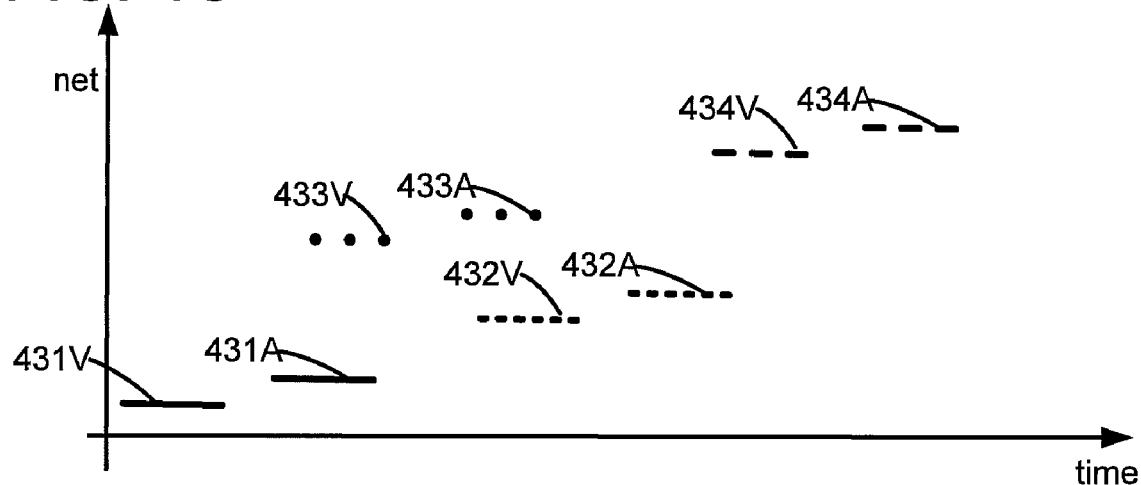
FIGS. 4C and 4D illustrate, in additional graphs, a net's identity on the y-axis and time on the x-axis, time shifted timing windows of a victim net and an aggressor net in four different samples in accordance with the invention, after performing act 217 of FIG. 2B, in accordance with the invention.
Figure 4D:
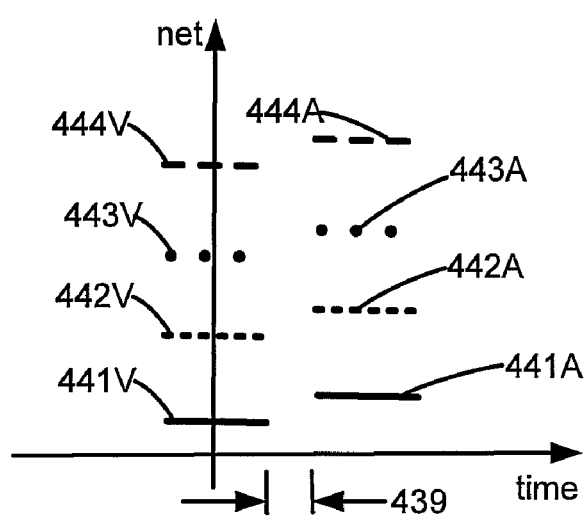

Operation of the Monte Carlo embodiment in an additional example using four die samples is illustrated in FIGS. 4C and 4D. Specifically, FIG. 4C illustrates four samples of four pairs of windows, each pair including one victim window and one aggressor window respectively labeled with the suffix "V" or "A" in the reference numeral. For example, 431V represents a victim timing window, and 431A represents its corresponding aggressor timing window. In this example, when act 216 is performed, the four victim timing windows 431V-434V are time shifted by respective four amounts (not shown in FIGS. 4C and 4D), so that the midpoints of the time shifted victim timing windows 441V-444V are aligned relative to one another as shown in FIG. 4D. Also in act 216, the four aggressor windows 431A-434A are time shifted by the same four amounts (used in time shifting the victim windows) to yield the respective time shifted aggressor timing windows 441A-444A. As seen from FIG. 4D, there is no timing overlap (see separation 439) between a combined victim window (not shown) formed using windows 441V-444V and a combined aggressor window (also not shown) formed using windows 441A-444A, although corresponding combined windows if formed in FIG. 4C would overlap.

As the same four amounts (not shown) are used to time shift the respective victim windows 431V-434V as are used to time shift the respective aggressor windows 431A-434A, the relative timing relationship within a sample remains unchanged. For example, within a first sample, windows 431V and 431A are separated by the same duration, relative to one another, as windows 441V and 441A. Use of time shifted windows illustrated in FIG. 4D to identify aggressors enables a suitably programmed computer to determine if there is any victim/aggressor overlap within an individual sample, regardless of overlap across samples and across process points.

Act 218 may be implemented in any manner well known in the art. Specifically, the combined timing windows are used in some embodiments of the invention, for crosstalk affected delay calculation by well known methods including, for example, as described in the following article which is incorporated by reference herein in its entirety: "Deep Sub-Micron Static Timing Analysis in Presence of Crosstalk" by Peivand F. Tehrani, Shang Woo Chyou and Uma Ekambaram, isqed, pp. 505, First International Symposium on Quality of Electronic Design, 2000. In one illustrative embodiment, this act is implemented as described in U.S. Pat. No. 6,405,348 entitled "Deep Sub-Micron Static Timing Analysis In The Presence Of Crosstalk" granted on Jun. 11, 2002 to Peivand Fallah-Tehrani and Shang-Woo Chyou, and this patent is incorporated by reference herein in its entirety.

The effect of global variation across a wafer which is removed by time shifting victim and aggressor windows, and accordingly the reduction in pessimism in crosstalk analysis as described herein, depends on the value of the predetermined fraction. Although a specific example of value of 0.5 has been used in the above description as the predetermined fraction in one embodiment (to find a victim window's center), other embodiments may use other values for the predetermined fraction, such as but not limited to any value between 0.0 and 1.0 (both values inclusive). For example, a value of 0.25 may be used in some embodiments as the predetermined fraction K, whereby windows of a victim, across multiple dies in a wafer, are aligned to one another at their first quartile location.

Also, although in one embodiment described above, the predetermined fraction K is applied to a victim's original window to determine a duration to be used as the amount $\Delta T$ for time shifting the victim and aggressor windows in each die, in alternative embodiments the predetermined fraction K is applied to an aggressor's original window to determine the duration to be used as the location-specific amount $\Delta T$. Most analysis schemes are victim net specific, thus this approach has the disadvantage that its aggressor net based.

Moreover, although in some embodiments a combined window is formed by using the earliest and latest die sample arrival times, other embodiments use human-specified boundaries for the windows, e.g. in the form of a percentile or a quantile value, such as $3\sigma$ values to form the combined window, as discussed next in reference to FIG. 4B. Specifically, in certain illustrative embodiments, computer 200 is programmed to compute a "$-3\sigma$" value which occurs at a time T25 that is prior to a center (not labeled) of an early side of arrival window 401 across all die samples, as an early side of a combined window 424. In the just-described embodiments, a "$+3\sigma$" value which occurs at a time T27 that is subsequent to the center (also not labeled) of the late side of arrival window 403 is used as the late side of the combined window 424.

In the just-described example, the multiple samples of the Monte Carlo embodiment are used to determine a probability density function 402 for the early side of arrival window 401, as well as another probability density function 404 for the late side of arrival window 403. As can be seen in FIG. 4B, a victim's combined window 424 does not overlap the aggressor's combined window 425 because these two windows are separated from each other by a duration 405 which is larger than the duration T23-T22 (FIG. 4A). Accordingly, use of $3\sigma$ windows as described above in reference to FIG. 4B further reduces pessimism in crosstalk analysis.

The above-described $-3\sigma$ value for the early side of window 424 is determined by computer 200 in the normal manner, e.g. by first computing a mean $\mu$ as the average of all arrival times at the victim net's input (or output), followed by computing a standard deviation $\sigma$ as the square-root of the average of the difference of each arrival time and the just-computed mean $\mu$, and then multiplying standard deviation $\sigma$ by the value $-3$ thereby to yield $-3\sigma$. The above-described $+3\sigma$ value for the late side of window 424 is further determined by computer 200, by multiplying $-1$ with the just-described $-3\sigma$.

Note that a crosstalk overlap analyzer of some embodiments identifies a net as an aggressor even if it attacks another net as its victim in one cycle but not in other cycles, as may occur, for example if one net operates at a faster clock than the other net.

Several alternative embodiments in accordance with the invention do not use Monte Carlo simulation, and instead use equations in a closed form manner to define probability density functions, and for this reason these embodiments ("closed form embodiments") do not use multiple samples of the type described above. Instead, acts 217A and 217B of FIG. 3B are performed in the closed form embodiments only once, using the centers of probability density functions to represent the early side and late side of the timing windows of the victim net and aggressor net. In certain embodiments, the probability density functions have a normal (i.e. Gaussian) distribution, and accordingly they are represented by just two values, namely mean $\mu$ and standard deviation $\sigma$. In other embodiments, the probability density functions do not have a normal distribution and instead have a different distribution that is still represented by a closed form equation.

In addition, in the closed form embodiments, computer 200 uses correlation to calculate covariance between the aggressor timing window and the victim timing window, used to modify the victim and aggressor probability density functions. The changed probability density functions are then used by computer 200 to form a combined victim window and a combined aggressor window, by identifying $+3\sigma$ and $-3\sigma$ points, in the normal manner.

Figure 5A:
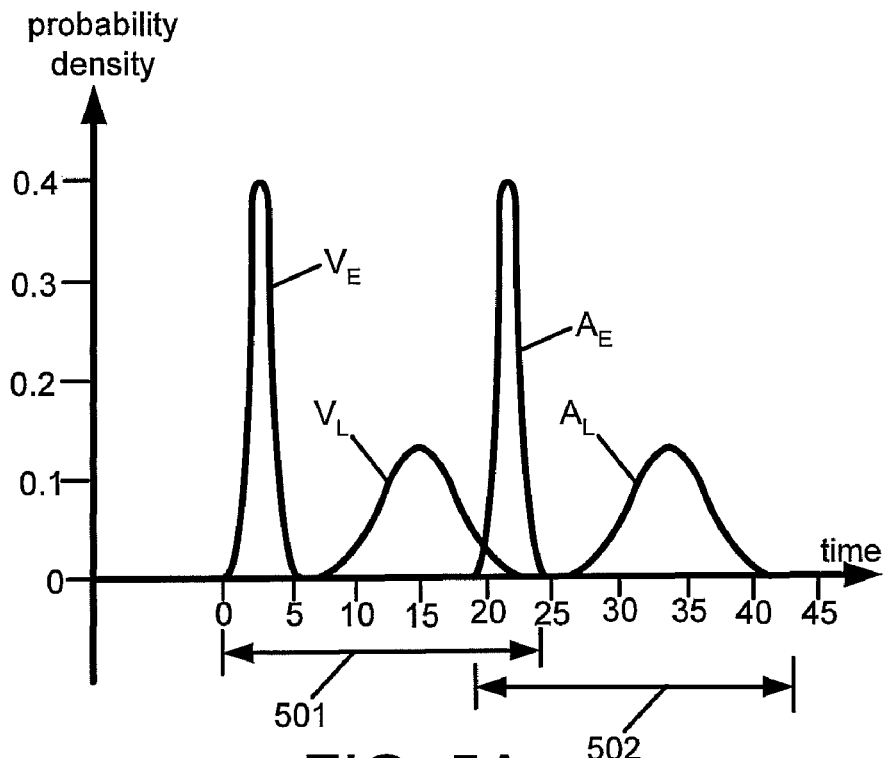
FIG. 5A illustrates, in a graph, probability density functions for late and early arrival times, of a victim net and an aggressor net in the prior art.

An illustrative example of the closed form embodiments is shown in FIG. 5A, wherein the victim timing window 501 has the following early and late probability density functions: $V_E = N(3,1)$, $V_L = N(15,3)$ at the respective sides, and the aggressor timing window 502 has the following early and late side distributions: $A_E = N(22,1)$, and $A_L = N(34,3)$. In the just-described closed form equations, N represents the normal (i.e. Gaussian) distribution, and the first value within the parenthesis represents mean μ at which a peak occurs, while the second value within the parenthesis represents standard deviation σ. Note that windows 501 and 502 are 3σ windows of the type described above. Hence, in the example shown in FIG. 5A, window 501 starts at −3σ which is located at −2 time units, and ends at +3σ which is located at +4 time units.

Assuming full correlation, victim timing window 501 and aggressor timing window 502 move together, i.e. these two windows are changed in an identical manner. Hence, in performing act 217, computer 200 uses equation $V_M=0.5*(V_E+V_L)$, wherein each of $V_M$, $V_E$ and $V_L$ is probability density function. Therefore, computer 200 performs a statistical add operation on the two probability density functions $V_E$ and $V_L$ in order to obtain the probability density function $V_M=N(9,2)$ which represents the identical duration $\Delta T$ to be identically removed from the victim and aggressor timing windows. Note that the mean μ for $V_M$ is the average of the early and late means, e.g. average of 3 and 15, while the standard deviation σ for $V_M$ is the average of the early and late standard deviations, i.e. average of 1 and 3.

Moreover, in performing act 218, computer 200 slides original victim window 501 (FIG. 5A) by computing a time-shifted victim window 503 (FIG. 5B) with an early side $V_{ET}=V_E-V_M$ and a late side $V_{LT}=V_L-V_M$. In the just-described equations, the subscript "T" denotes a transformed version. Note that the just-described computation of $V_{ET}$ and $V_{LT}$ are also statistical subtract operations. Hence, in the example illustrated in FIG. 5A, these operations result in an early side probability density function $V_{ET}=N(-6,1)$ and a late side probability density function $V_{LT}=N(6,1)$, which are together used to define the victim's 3σ timing window.

Computer 200 also slides original aggressor window 502 (FIG. 5A) by computing a time-shifted aggressor window 504 (FIG. 5B) with an early side probability density function $A_{ET}=A_E-V_M$ and a late side probability density function $A_{LT}=A_L-V_M$, wherein each of $A_{ET}$, $A_E$, $V_M$, $A_{LT}$ and $A_L$ is a probability density function, to yield in this example $A_{ET}=N(13,1)$ and $A_{LT}=N(25,1)$ together used to define the aggressor's 3σ timing window. Note that the mean μ for $A_{LT}$ is the arithmetic subtraction of the two means of $A_L$ and $V_M$ (e.g. 34-9), while the standard deviation σ for $A_{LT}$ is the square-root of the following: sum of the squares of the standard deviations of $A_L$ and $V_M$ from which is subtracted twice the product of the standard deviations of $A_L$ and $V_M$ (e.g. square-root of $3^2+2^2-2*3*2$).

Note that in the just-described example, correlation is assumed to be 1.0. However, in a more general situation wherein correlation information other than 1.0 is available, the following formula is used to perform a statistical subtraction (to compute each of $V_{ET}$, $V_{LT}$, $A_{ET}$ and $A_{LT}$ as the variable z, based on the respective two input variables x and y): $\sigma_z^2=\sigma_x^2+\sigma_y^2-2*Cov(x, y)$, wherein Cov(x, y) is the covariance function. In Monte Carlo embodiments, covariance may be computed from information on each sample, for each pair of victim and aggressor as follows: $Cov(x, y)=1/N*(\Sigma x_i y_i)-\mu_x \mu_y$, wherein N is the total number of samples, $x_i$ represents arrival time at an input (or output) of a victim in sample i and $y_i$ represents the arrival time at an input (or output) of the aggressor in sample i, while $\mu_x$ is the average of arrival times for victims in all samples i.e. $1/N*(\Sigma x_i)$ and $\mu_y$ represents the average of arrival times for aggressors in all samples i.e. $1/N*(\Sigma y_i)$. Another advantage of the Monte Carlo is that distributions could be obtained directly from the samples, so quantities such as mean and sigma can be calculated from the distributions in a direct manner.

Figure 5B:
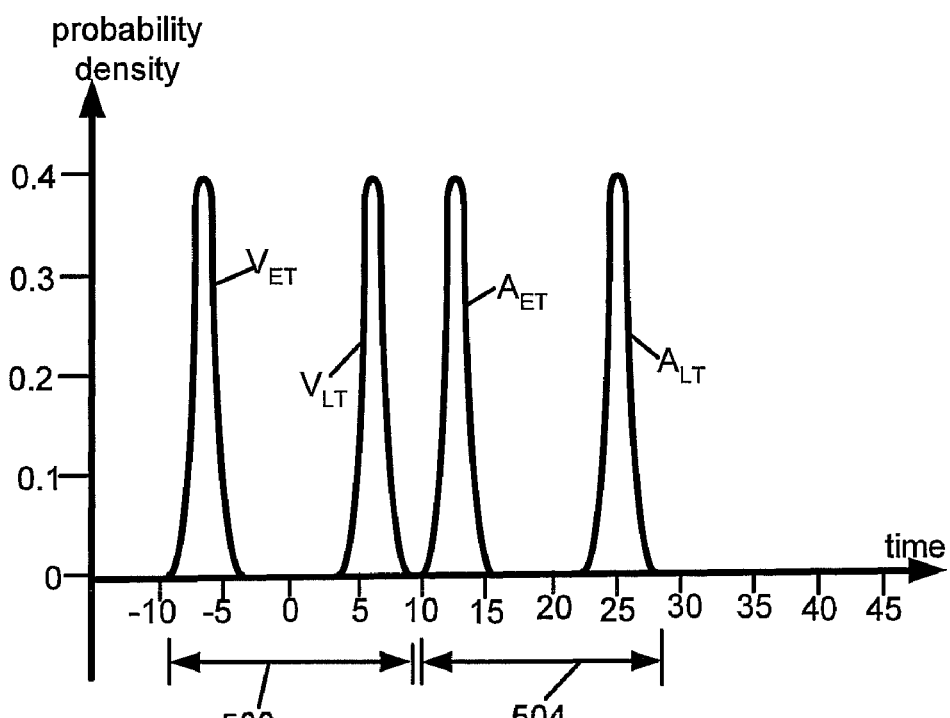
FIG. 5B illustrates, in a graph, probability density functions after performing act 217 of FIG. 2B, in accordance with the invention.

Note that in the example illustrated in FIGS. 5A and 5B, although the original 3σ windows 501 and 502 overlap one another as shown in FIG. 5A, there is no overlap between corresponding time-shifted windows 503 and 504 as shown in FIG. 5B. Hence, in the illustrated example, at this stage computer 200 determines that there is no need to look for crosstalk impact between the victim net and the aggressor net, because there is no overlap.

In some embodiments, if at the end of act 215 (FIG. 2B), one or more timing violations are found; an additional operation 600 is optionally performed before performing act 220 described above. Operation 600 is optional, depending on the embodiment, for example, to address situations in which multiple overlaps are reported, although they do not exist. Note that a user may decide to skip operation 600 in case there are just a small number of timing violations that the user fixes manually. However, pessimism inherent in the list of victim and aggressors produced by act 214 is further addressed in some embodiments of the invention by further pessimism reduction via a path based analysis as illustrated in FIGS. 6A-6C, as discussed below.

Initially, in act 616, a victim and its aggressor(s) are identified, and an edge of the victim net and a timing window of the aggressor net(s) are retrieved. Note that although a victim is associated with a timing window in a block based approach described above in reference to act 214, in act 616 an edge (at a user-specified time) is propagated through a path until it reaches the victim net. Specifically, as illustrated in FIG. 6B, computer 200 retrieves, for a die sample "die1", a victim net's edge 623A (that occurs at time T61) and the corresponding aggressor net's timing window 625A that starts at time T62 and ends at time T66. Similarly, computer 200 retrieves, for another die sample "die2", the same victim net's edge 623B (that occurs at time T63) and the same aggressor net's timing window 625B that starts at time T65 and ends at time T67. Note that the victim and aggressor were identified at this stage by act 214, and if crosstalk overlap analysis were to be performed on the retrieved data, a combined window for the aggressor spans the time range from T62 to T67 within which falls the time T63 at which occurs the edge 623B of the victim net in die2, thereby to identify an overlap.

Thereafter, in act 617, computer 200 time shifts the victim net's timing edge and the aggressor net's timing window by an amount that is identical to the victim net's timing edge in each die sample. In doing so, a relative offset, between the victim net's timing edge and the aggressor net's timing window for the each die sample remains unchanged. In the example illustrated in FIG. 6B, computer 200 time shifts timing edge 623A by the victim-specific amount $\Delta T1=T61$ (which is the time at which edge 623A occurs) and also time shifts the victim timing window 625A by the same victim-specific amount $\Delta T1=T61$. Additionally, computer 200 further time shifts timing edge 623B by the victim-specific amount $\Delta T2=T63$ (which is the time at which edge 623B occurs) and also time shifts the aggressor timing window 625B by the same victim-specific amount $\Delta T2=T63$. The results of time shifting are shown in FIG. 6C, wherein die1's aggressor timing window starts at time T71 and ends at time T74, whereas die 2's aggressor timing window starts at time T72 and ends at time T73.

Next, in an act 618, computer 200 forms a combined victim timing edge and also forms a combined aggressor timing window. In the above-described example shown in FIG. 6C, the combined aggressor timing window starts at time T71 and ends at time T74 (i.e. it happens to be same as the aggressor timing window for die1). Thereafter, in act 619, computer 200 checks for overlap between the combined victim timing edge (located at the time origin), and the combined aggressor timing window, i.e. checks if the combined aggressor timing window spans across the time origin and if not then there is no overlap. If computer 200 finds an overlap in act 619 then timing analysis is again performed, to obtain delays, followed by checking for a timing violation (these acts are not shown in FIG. 6A, and they are similar or identical to the above-described acts 225 and 215 shown in FIG. 2B), followed by exiting this operation 600. On exiting operation 600, computer 200 returns to the above-described process flow illustrated in FIG. 2B, i.e. proceeds to act 220 (described above). As will be readily apparent to the skilled artisan, performing operation 600 further reduces pessimism (relative to act 214), in victim and aggressor timing overlap detection in variation aware static timing analysis.

Note that although some embodiments use the methods illustrated in FIGS. 2B and 6A with variation aware data and a variation aware static timing analysis tool, other embodiments may use other kind of data on other kinds of static timing analysis tools. For example, the methods of FIGS. 2A and/or 6A in some embodiments are used in a corner specific static timing analysis tool with corner data (e.g. for a fast corner and for a slow corner). Accordingly, a static timing analysis tool as used herein refers to a corner specific static timing analysis tool, or a variation aware static timing analysis tool or any other kind of static timing analysis tool. Similarly, a parasitic extraction tool as used herein refers to a corner specific parasitic extraction tool, or a variation aware parasitic extraction tool or any other kind of parasitic extraction tool.

Note that variation aware parasitics are parasitics that are generated by the parasitic extraction tool for one or more properties (e.g. geometry) of the layout that are not fixed, i.e. that vary over a user-specified distribution. Moreover, corner-specific parasitics are parasitics generated for one or more fixed properties (e.g. geometry) of the layout, related to a user-specified corner. Additionally, as will be readily apparent to the skilled artisan in view of this disclosure, if there is even one property in an IC design under simulation that can vary, such as a parasitic or a property of the IC design, then various embodiments of computer 200 automatically generate variation aware timing windows (i.e. with early and late distributions for signal arrival), instead of timing windows that have early and late edges.

Figure 7:
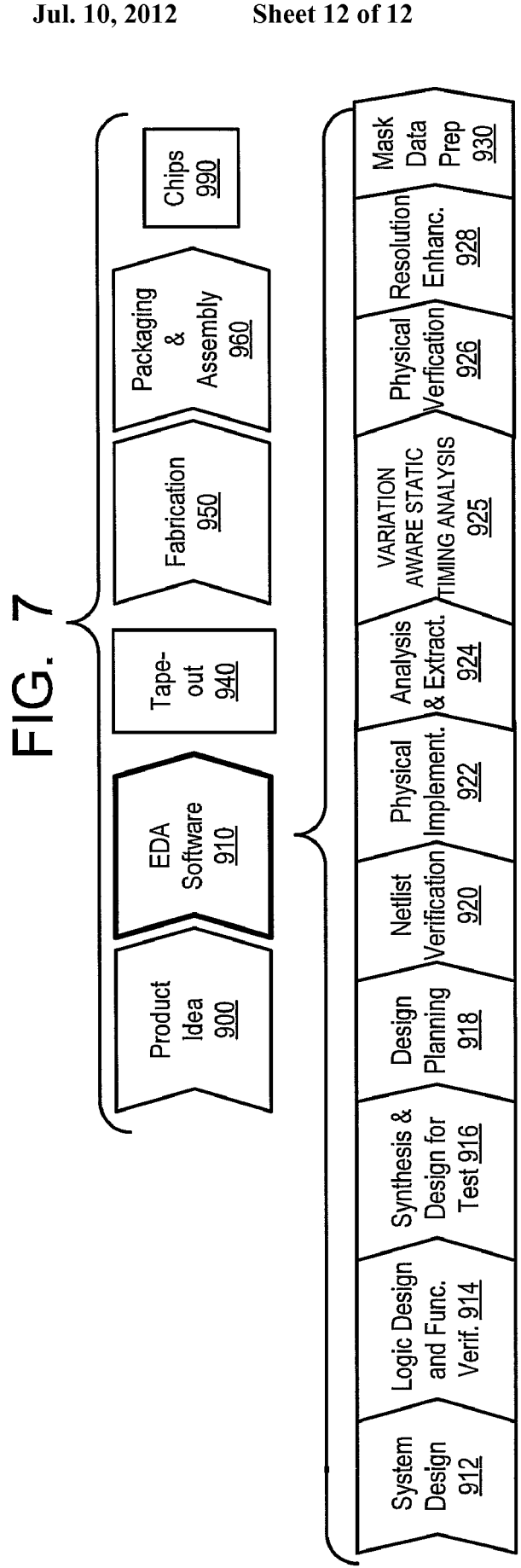
FIG. 7 illustrates a simplified representation of an exemplary digital ASIC design flow in accordance with the invention.

Accordingly, the method of FIG. 2B is used in some embodiments of an EDA software design process (shown as 910 in FIG. 7). Process 910 (FIG. 7) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime® products (applied to pre-layout IC designs). Note that timing analysis at this stage is performed in PrimeTime® based on simplified models that do not take into account capacitive coupling and crosstalk.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Note that an ECO generator 999B (of the type described above in reference to FIG. 2A) can be used in an iteration through this stage 922, as shown in FIG. 7, after ECO constraints have been generated. Although circuitry and portions thereof (such as rectangles) may be thought of at this stage as if they exist in the real world, it is to be understood that at this stage only a layout exists in a computer 200. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this includes Star RC/XT-VX which can do corner specific parasitics extraction and/or variation aware parasitics extraction, Raphael, Aurora and PrimeTime® SI products (applied to post-layout IC designs). Note that timing analysis at this stage is performed in PrimeTime® SI based on capacitive coupling and crosstalk models. Hence, some embodiments use PrimeTime® SI at this stage to generate timing windows without time shifting.

Variation aware timing analysis (stage 925): At this stage, act 214 (FIG. 2B) is performed by slider 206 (FIG. 2A) to time shift the timing windows as described above. A crosstalk overlap analyzer included in PrimeTime® VX is used in this stage, with time shifted timing windows as input to identify a victim and its aggressors and store their identities in a list. The list is thereafter used to perform crosstalk affected delay calculations and identify critical nets, also by invoking PrimeTime® VX. Note that PrimeTime® VX can be used to perform corner specific static timing analysis and/or variation aware static timing analysis.

Physical verification (stage 926): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this stage include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS® family of products. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the storage medium holds computer instructions for carrying out one or more steps performed by the method illustrated in FIG. 2B.

Note that a computer system used in some embodiments to implement variation aware timing analysis 925, including time shifting of timing windows as described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure. Accordingly, numerous modifications and adaptations of the embodiments described herein are encompassed by the scope of the invention.

The following ATTACHMENT A is an integral part of this detailed description and is incorporated by reference herein in its entirety. This appendix provides further detailed description of an implementation of certain illustrative embodiments of the type shown in FIG. 2B.

ATTACHMENT A

```
Perform timing window alignment
Description: Find scalar bound representing victim and aggressor arrival
windows
Input: Victim Net
Outputs: Scalar bounds for victim and aggressor windows to be used in
identifying impact of aggressors on a victim, for static timing analysis
Produce bounding arrival windows (victim net) {
    V = Get sampled base timing arrival window (victim net)
    Vm = Calculate sample based victim window adjustment (V)
    Vt = Adjust Early/Late arrival distributions (V, Vm)
    Vb = Find Early/Late bounds for arrival windows (Vt)
    Get active aggressor list for victim net
    For each aggressor net in the aggressor list {
        A = Get sampled base timing arrival window (aggressor net)
        At = Adjust Early/Late arrival distributions (A, Vm)
        Ab = Find Early/Late bounds for arrival windows (At)
    }
    Return victim/aggressor bounding arrival windows
}
Get sampled base timing arrival window
Description: Given a net returns its sample based timing arrival windows
Input: net
```

ATTACHMENT A -continued

```
Output: sample based timing arrival windows
Get sample based timing arrival window (net) {
    Assume N is number of samples
    Return N samples of early/late timing arrival windows
}
Calculate sample based victim window adjustment
Description: Given victim's sample based timing arrival window,
calculates victim window adjustment
Input: victim's Sample based timing arrival window
Output: sample based victim window adjustment
Calculate sample based victim window adjustment (V) {
    K = given adjustment factor (between 0.0 and 1.0)
    Ve = victim's early side of the timing arrival window
    Vl = victim's late side of the timing arrival window
    For each of N samples {
        Vm = K.Ve + (1.0 − K). Vl
    }
    Return N samples of Vm
}
Adjust Early/Late arrival distributions
Description: Given a sample based arrival timing window and sample
based adjustment values, calculate adjusted early/late side of timing
arrival windows. This is applied to victim and aggressor
windows similarly.
Inputs: A sample based timing arrival window (X), sample based arrival
timing window adjustment values (Vm)
Output: Adjusted timing arrival window (Y)
Adjust Early/Late arrival distributions (X, Vm) {
    Xe = early side of the timing arrival window
    Xl = late side of the timing arrival window
    For each of N samples {
        Ye = Xe − Vm
        Yl = Xl − Vm
    }
    Return Y
}
```

What is claimed is:

1. A method to analyze a design of an integrated circuit (IC) device, said design comprising a layout and parasitics for the IC device, the method comprising:

at a computer, using a static timing analysis tool to generate a plurality of timing windows of a corresponding plurality of nets in said design based on the layout and said parasitics of the IC device, wherein said plurality of nets are included in each die of a plurality of dies in a wafer;

identifying a plurality of pairs of timing windows from said plurality of timing windows each pair of timing windows comprising a victim timing window representing a variation in arrival time of a victim signal at an input or output of a victim net in said plurality of nets and an aggressor timing window for arrival representing a variation in arrival time of an aggressor signal at an input or output of an aggressor net in said plurality of nets;

moving said victim timing window by an amount for said die based on a position of one or more edges of said victim timing window for said die relative to corresponding victim timing windows of other dies of said plurality of dies;

forming for said victim net, a combined victim window representing a plurality of arrival times of said victim signal in said die and said other dies of said plurality of dies, based at least partially on a moved victim timing window;

forming for said aggressor net, a combined aggressor window representing a plurality of arrival times of said aggressor signal in said die and said other dies of said plurality of dies, based at least partially on a moved aggressor timing window;

determining overlap between said combined victim window and said combined aggressor window; and
determining a delay of the victim signal when an overlap is determined to occur between said combined victim window and said combined aggressor window.

2. The method of claim h wherein said moving comprises:
calculating a time at which occurs a fraction of one of said victim timing window and said aggressor timing window; and
changing by said calculated time, each of: a first side of said victim timing window, a second side of said victim timing window, a first side of said aggressor timing window and a second side of said aggressor timing window, wherein said first side of said victim and said aggressor timing window occurs earlier in time than said second side of said victim and said aggressor timing window.

3. The method of claim 2, wherein:
said fraction is in a middle region of said victim timing window.

4. The method of claim 2, wherein said calculating comprises:
computing as said time, $Vm = K*Ve + (1.0-K)*Vl$;
wherein: K is said fraction being a value between 0.0 and 1.0;
Ve is a first time representing an early side of said victim timing window; and
Vl is a second time representing a late side of said victim timing window.

5. The method of claim h wherein said moving further comprises, aligning a point identified by applying a fraction to the victim timing window in one die sample within a wafer with a corresponding point identified by applying said fraction to said timing window of said victim net in another die sample of said wafer.

6. The method of claim 5, wherein said fraction being a value of 0.5, and said point is at a center of said victim timing window for one die sample and said corresponding point is at a center of said timing window of said victim net in another die sample of said wafer.

7. The method of claim 1, further comprising:
moving by said amount, an aggressor timing window in a group comprising said victim timing window.

8. The method of claim 1, further comprising:
computing a first probability density function related to said aggressor timing window and a second probability density functions related to said victim timing window, based on victim and aggressor correlation; and
determining overlap between said combined victim window and said combined aggressor window by applying first probability density function and said second probability density function.

9. The method of claim 1, further comprising:
using said result to determine a crosstalk delay in said victim net;
identifying a net in said design of said IC device as being associated with a timing violation based at least in part on said crosstalk delay; and
storing in said memory an identity of said net for being associated with the timing violation.

10. The method of claim 1, further comprising:
fabricating said IC device within a wafer of a semiconductor material based at least partially on a revised version of said design stored in said memory of said computer.

11. The method of claim 1, wherein said parasitics being generated by a parasitic extraction tool for one or more properties of the layout.

12. The method of claim 1, wherein said parasitics being associated with a process corner.

13. The method of claim 1, further comprising:
using delays obtained by said performing to identify timing violations; and
obtaining said revised IC design, based at least partially on said identified timing violations and based on external input.

14. The method of claim 1, further comprising:
obtaining said layout by using a place and route tool; and
obtaining said parasitics by invoking a parasitic extraction tool based at least partially on the layout.

15. The method of claim 1, further comprising:
using said result to determine a crosstalk delay in said victim net;
identifying a net in said design of said IC device as being associated with a timing violation based at least in part on said crosstalk delay; and
storing in said memory an identity of said net for being associated with the timing violation.

16. An integrated circuit (IC) fabricated by an analyzing process, the process comprising:
at a computer, using a static timing analysis tool to generate a plurality of timing windows of a corresponding plurality of nets in said design based on the layout and the parasitics of the IC device, wherein the plurality of nets is included in each die of a plurality of dies in a wafer;
identifying a plurality of pairs of timing windows from the plurality of timing windows, each pair of timing windows comprising a victim timing window representing a variation in arrival time of a victim signal at an input or output of a victim net in said plurality of nets and at least one aggressor timing window representing a variation in arrival time of an aggressor signal at an input or output of an aggressor net in said plurality of nets;
moving said victim timing window by an amount for said die based on a position of one or more edges of the victim timing window for said die relative to corresponding victim timing windows of other dies of said plurality of dies;
forming for said victim net, a combined victim window representing a plurality of arrival times of said victim signal in said die and said other dies of said plurality of dies, based at least partially on a moved victim timing window;
forming for said aggressor net, a combined aggressor window representing a plurality of arrival times of said aggressor signal in said die and said other dies of said plurality of dies based at least partially on a moved aggressor timing window;
determining overlap between said combined victim window and said combined aggressor window; and
determining a delay of the victim signal when an overlap is determined to occur between said combined victim window and said combined aggressor window.

17. The integrated circuit of claim 16, wherein said moving comprises:
calculating a time at which occurs a fraction of one of said victim timing window and said aggressor timing window; and
changing by said calculated time, each of (i) a first side of said victim timing window, (ii) a second side of said victim timing window, (iii) a first side of said aggressor timing window and (iv) a second side of said aggressor timing window, wherein said first side of said victim and said aggressor timing window occurs earlier in time than said second side of said victim and said aggressor timing window.

18. The integrated circuit of claim 17, wherein said calculating comprises:
    computing as said time, Vm=K*Ve+(1.0−K)*Vl;
    wherein K is said fraction being a value between 0.0 and 1.0;
    Ve is a first time representing an early side of said victim timing window; and
    Vl is a second time representing a late side of said victim timing window.

19. The integrated circuit of claim 16, wherein said fraction is in a middle region of said victim timing window.

20. The integrated circuit of claim 16, wherein said moving further comprises, aligning a point identified by applying a fraction to the victim timing window in one die sample within a wafer with a corresponding point identified by applying said fraction to said timing window of said victim net in another die sample of said wafer.

21. The integrated circuit of claim 16, wherein the process further comprises:
    moving by said amount, an aggressor timing window in a pair comprising said victim timing window.

22. The integrated circuit of claim 16, wherein the process further comprises:
    computing a first probability density function related to said aggressor timing window and a second probability density functions related to said victim timing window, based on victim and aggressor correlation; and
    determining overlap between said combined victim window and said combined aggressor window by applying first probability density function and said second probability density function.

* * * * *

UNITED STATES PATENT AND TRADEMARK OFFICE
CERTIFICATE OF CORRECTION

| | |
|---|---|
| PATENT NO. | : 8,219,952 B2 |
| APPLICATION NO. | : 12/391241 |
| DATED | : July 10, 2012 |
| INVENTOR(S) | : Peivand Fallah-Tehrani, Christopher Papademetrious and Nahmsuk Oh |

It is certified that error appears in the above-identified patent and that said Letters Patent is hereby corrected as shown below:

In claim 1, column 18, line 46, insert --,-- between "window" and "each".

In claim 1, column 18, line 50, delete "for arrival" between "window" and "representing".

In claim 2, column 19, line 6, replace the "h" after "claim" with --1--.

In claim 5, column 19, line 30, replace the "h" after "claim" with --1--.

Signed and Sealed this
Eleventh Day of September, 2012

David J. Kappos
*Director of the United States Patent and Trademark Office*